United States Patent
Burak et al.

(10) Patent No.: US 8,872,604 B2
(45) Date of Patent: Oct. 28, 2014

(54) DOUBLE FILM BULK ACOUSTIC RESONATORS WITH ELECTRODE LAYER AND PIEZO-ELECTRIC LAYER THICKNESSES PROVIDING IMPROVED QUALITY FACTOR

(75) Inventors: Dariusz Burak, Fort Collins, CO (US); Chris Feng, Fort Collins, CO (US); Alexandre Shirakawa, San Jose, CA (US); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 625 days.

(21) Appl. No.: 13/101,376

(22) Filed: May 5, 2011

(65) Prior Publication Data
US 2012/0280767 A1 Nov. 8, 2012

(51) Int. Cl.
H03H 9/54 (2006.01)
H03H 9/56 (2006.01)
H03H 9/58 (2006.01)
H03H 9/205 (2006.01)

(52) U.S. Cl.
CPC ............... *H03H 9/56* (2013.01); *H03H 9/582* (2013.01); *H03H 9/205* (2013.01); *H03H 9/587* (2013.01); *H03H 9/566* (2013.01)
USPC ............ 333/189; 310/324; 310/334; 310/366

(58) Field of Classification Search
CPC ......... H03H 9/13; H03H 9/173; H03H 9/174; H03H 9/205; H03H 9/48; H03H 9/50; H03H 9/52; H03H 9/54; H03H 9/56; H03H 9/564; H03H 9/566; H03H 9/58; H03H 9/582; H03H 9/583; H03H 9/585; H03H 9/587; H03H 9/588
USPC .......... 333/187, 189–192; 310/321–324, 328, 310/334, 335, 365, 366
See application file for complete search history.

(56) References Cited

U.S. PATENT DOCUMENTS 5,382,930 A * 1/1995 Stokes et al. .................. 333/191
5,587,620 A 12/1996 Ruby et al.
(Continued)

FOREIGN PATENT DOCUMENTS

JP 2007/028669 2/2007

OTHER PUBLICATIONS

Roy et al.; "Spurious Modes Suppression in Stacked Crystal Filter"; published in: Applications and Technology Conferences (LISAT), 2010 Long Island Systems, May 7, 2010, pp. 1-6.*

(Continued)

*Primary Examiner* — Barbara Summons (57) ABSTRACT

A device includes: a first electrode having a first electrode thickness; a first acoustic propagation layer disposed on the first electrode, the first piezo-electric layer having a first acoustic propagation layer thickness; a second electrode having a second electrode thickness; a second piezo-electric layer disposed on the first electrode, the second piezo-electric layer having a second acoustic propagation layer thickness; and a third electrode having a third electrode thickness, wherein the second electrode thickness is between 1.15 and 1.8 times the first electrode thickness. The first and third electrode thicknesses may be equal to each other, and the first and second piezo-electric layer thicknesses may be equal to each other. The first and third electrodes may be connected together to provide two acoustic resonators in parallel with each other.

14 Claims, 11 Drawing Sheets

(56) References Cited

U.S. PATENT DOCUMENTS

| | | | |
|---|---|---|---|
| 5,873,153 A | 2/1999 | Ruby et al. | |
| 5,910,756 A * | 6/1999 | Ella | 333/133 |
| 6,081,171 A * | 6/2000 | Ella | 333/189 |
| 6,107,721 A | 8/2000 | Lakin | |
| 6,150,703 A | 11/2000 | Cushman et al. | |
| 6,396,200 B2 | 5/2002 | Misu et al. | |
| 6,507,983 B1 | 1/2003 | Ruby et al. | |
| 6,617,751 B2 | 9/2003 | Sunwoo et al. | |
| 6,788,170 B1 * | 9/2004 | Kaitila et al. | 333/187 |
| 6,927,649 B2 * | 8/2005 | Metzger et al. | 333/133 |
| 7,057,478 B2 * | 6/2006 | Korden et al. | 333/189 |
| 7,212,083 B2 * | 5/2007 | Inoue et al. | 333/189 |
| 7,230,509 B2 * | 6/2007 | Stoemmer | 333/133 |
| 7,233,218 B2 | 6/2007 | Park et al. | |
| 7,268,647 B2 | 9/2007 | Sano et al. | |
| 7,280,007 B2 | 10/2007 | Feng et al. | |
| 7,345,410 B2 | 3/2008 | Grannen et al. | |
| 7,358,831 B2 | 4/2008 | Larson et al. | |
| 7,388,454 B2 | 6/2008 | Ruby et al. | |
| 7,554,427 B2 * | 6/2009 | Matsumoto et al. | 333/187 |
| 7,619,493 B2 | 11/2009 | Uno et al. | |
| 7,629,865 B2 | 12/2009 | Ruby | |
| 7,768,364 B2 | 8/2010 | Hart et al. | |
| 8,198,958 B1 * | 6/2012 | Aigner et al. | 333/189 |
| 2006/0164183 A1 * | 7/2006 | Tikka et al. | 333/133 |
| 2007/0176710 A1 * | 8/2007 | Jamneala et al. | 333/191 |
| 2007/0205850 A1 | 9/2007 | Jamneala et al. | |
| 2008/0055020 A1 * | 3/2008 | Handtmann et al. | 333/189 |
| 2009/0079514 A1 * | 3/2009 | Jamneala et al. | 333/133 |
| 2009/0096549 A1 * | 4/2009 | Thalhammer et al. | 333/189 |
| 2009/0127978 A1 | 5/2009 | Asai et al. | |
| 2009/0273415 A1 * | 11/2009 | Frank et al. | 333/187 |
| 2010/0013575 A1 * | 1/2010 | Inoue et al. | 333/187 |
| 2010/0052815 A1 | 3/2010 | Bradley et al. | |
| 2010/0176899 A1 | 7/2010 | Schaufele et al. | |
| 2010/0187948 A1 | 7/2010 | Sinha et al. | |
| 2010/0327697 A1 | 12/2010 | Choy et al. | |
| 2010/0327994 A1 | 12/2010 | Choy et al. | |
| 2011/0131774 A1 * | 6/2011 | Miyake | 29/25.35 |
| 2011/0204995 A1 * | 8/2011 | Jamneala et al. | 333/187 |

OTHER PUBLICATIONS

Handtmann et al.; "Stacked Crystal Resonator: A Highly Linear BAW Device"; 2009 IEEE International Ultrasonics Symposium Proceedings (IUS), Sep. 20-23, 2009, pp. 889-892.*

Chu et al.; "Influence of Different Piezoelectric Materials and Thicknesses on the Performance of Stacked Crystal Film Bulk Acoustic Wave Filters"; Published in: Piezoelectricity, Acoustic Waves, and Device Applications (SPAWDA) and 2009 China Symposium on Frequency Control Technology, Joint Conference, Dec. 17-20, 2009, pp. 433-437.*

Co-pending U.S. Appl. No. 13/074,262, filed Mar. 29, 2011.

Co-pending U.S. Appl. No. 13/074,094, filed Mar. 29, 2011.

Bi, F.Z., "Bulk Acoustic Wave RF Technology", *IEEE Microwave Magazine*, vol. 9, Issue 5, Oct. 2008, pp. 65-80.

Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.

* cited by examiner

DOUBLE FILM BULK ACOUSTIC RESONATORS WITH ELECTRODE LAYER AND PIEZO-ELECTRIC LAYER THICKNESSES PROVIDING IMPROVED QUALITY FACTOR

BACKGROUND

There is an increasing demand for mobile communication devices capable of operating across a variety of different frequency bands. For example, there is an increasing demand for cellular or mobile telephones that can operate in multiple frequency bands. In such devices, transmit and receive filters may be employed for each transmit and receive frequency band. In practice, various types of acoustic resonators, including bulk acoustic wave (BAW) resonators, may be employed to construct filters for appropriate applications. In general, BAW resonators may include thin film bulk acoustic resonators (FBARs) and Solid Mounted Resonators (SMRs). BAW resonators may also be employed to construct oscillators, including tunable voltage controlled oscillators (VCOs) for some applications.

A typical implementation of an acoustic resonator comprises a piezo-electric layer (e.g., a layer of piezoelectric material) disposed between two electrically-conductive (e.g., metal) electrodes.

Figure 1:
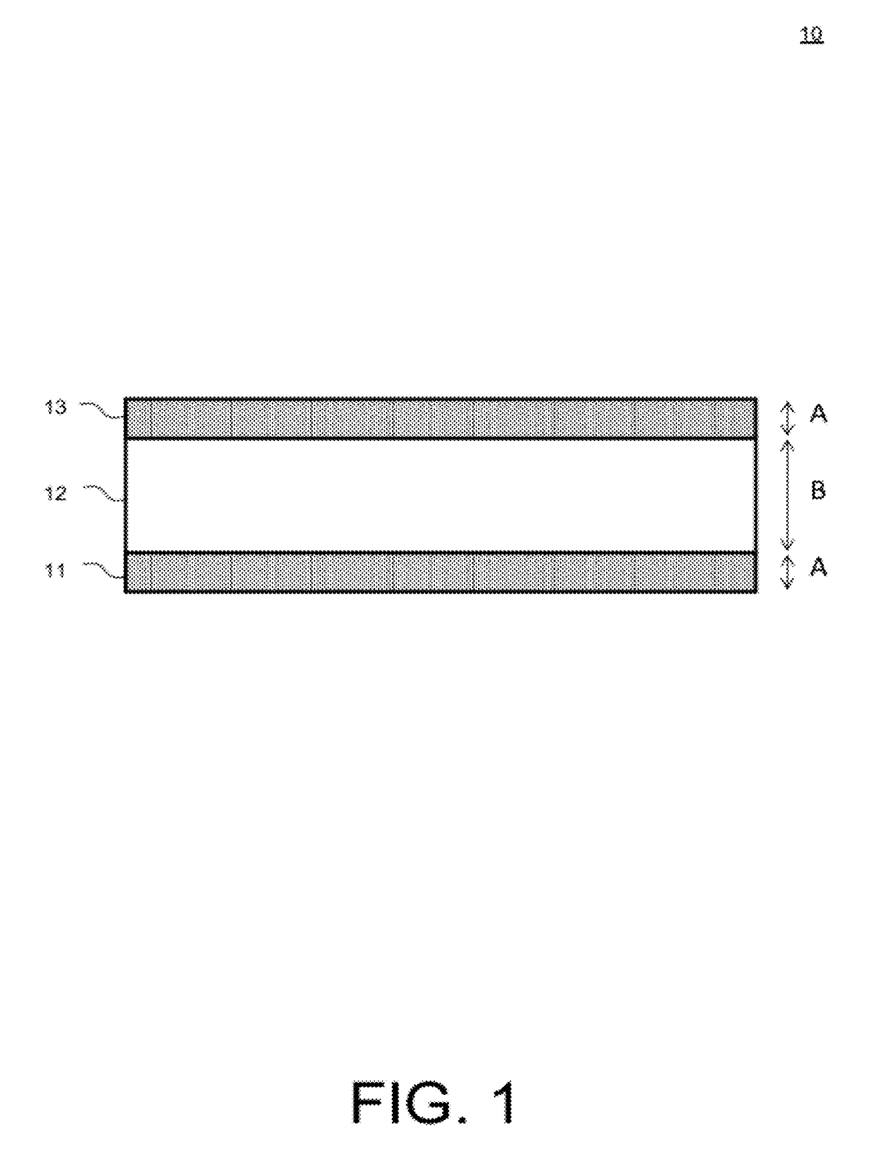
FIG. 1 illustrates a cross-section of an exemplary acoustic resonator.

FIG. 1 shows a cross-section through an exemplary acoustic resonator 10 which comprises a piezo-electric layer, which will be referred to below as piezoelectric layer 12, disposed between a first, or bottom, electrode 11, and a second, or top, electrode 13. The designations top electrode and bottom electrode are just for definition purposes and do not represent any limitation with regard to the spatial arrangement and positioning of acoustic resonator 10.

If an electric field is applied between first electrode 11 and second electrode 13 of acoustic resonator 10, the reciprocal or inverse piezoelectric effect will cause acoustic resonator 10 to mechanically expand or contract, the case of expansion or of contraction depending on the polarization of the piezoelectric material. This means that the opposite case applies if the electric field is inversely applied between the electrodes 11 and 13. In the case of an alternating field, an acoustic wave is generated in piezoelectric layer 12, and, depending on the implementation of acoustic resonator 10, this wave will propagate, for example, in parallel with the electric field, as a longitudinal wave, or, as a transversal wave, transverse to the electric field, and will be reflected, for example, at the interface of piezoelectric layer 12. For longitudinal waves, whenever the thickness d of piezoelectric layer 12 and of the top and bottom electrodes equals an odd (1, 3, 5 . . . ) integer multiple of half the wavelength $\lambda$ of the acoustic waves, resonance states and/or acoustic resonance vibrations will occur. Because each acoustic material has a different propagation velocity for the acoustic wave, the fundamental resonance frequency, i.e. the lowest resonance frequency $F_{RES}$, will then be inversely proportional to weighted sum of all thicknesses of the resonator layers.

The piezoelectric properties and, thus, also the resonance properties of an acoustic resonator depend on various factors, e.g. on the piezoelectric material, the production method, the polarization impressed upon the piezoelectric material during manufacturing, and the size of the crystals.

Figure 2:
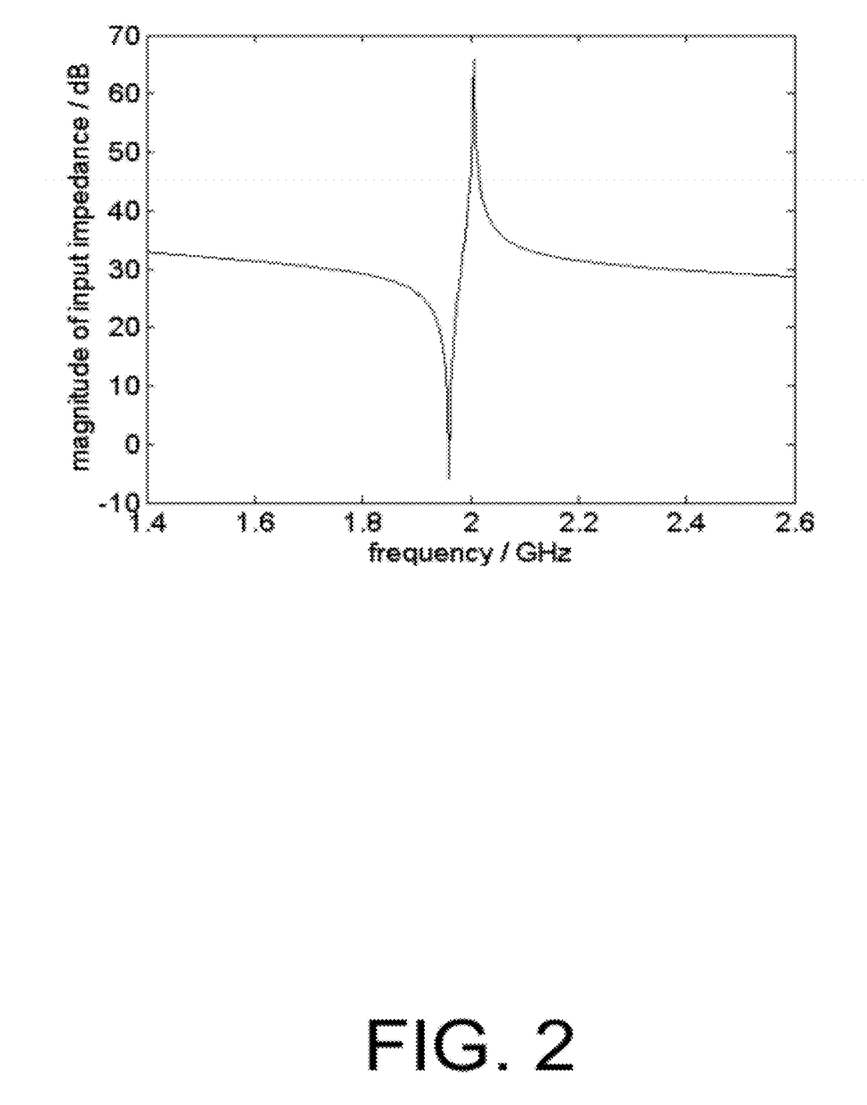
FIG. 2 illustrates an example input impedance response versus frequency for an acoustic resonator.

FIG. 2 illustrates an example logarithmic input impedance response versus frequency for an example acoustic resonator. As shown in FIG. 2, in general the input impedance of an acoustic resonator will exhibit a sharp negative-going peak from a series resonance at a lower frequency $f_S$, and a sharp positive-going peak from a parallel resonance at a higher frequency $f_P$.

Figure 3A:
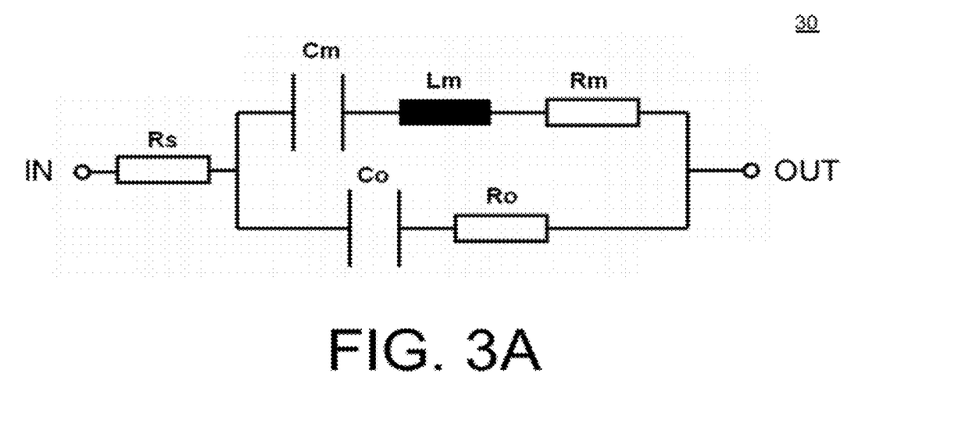
FIG. 3A shows an electrical model of a bulk acoustic wave (BAW) resonator—for example a thin film bulk acoustic resonator (FBAR).

FIG. 3A shows a model of a bulk acoustic wave (BAW) resonator—for example a thin film bulk acoustic resonator (FBAR). The model of FIG. 3A is a modified Butterworth-Van Dyke model (MBVD) model. The frequency response of this model is a bandpass response, with frequencies below the passband being attenuated by the capacitors Cm and Co, and with frequencies above the passband being attenuated by the inductance Lm.

Figure 3B:
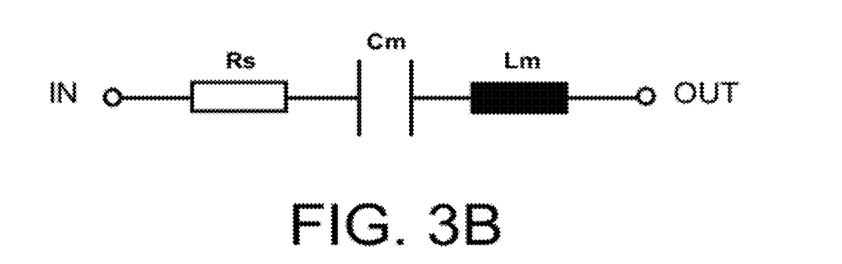
FIG. 3B shows a simplified model of a BAW resonator or FBAR at series resonance.
Figure 3C:
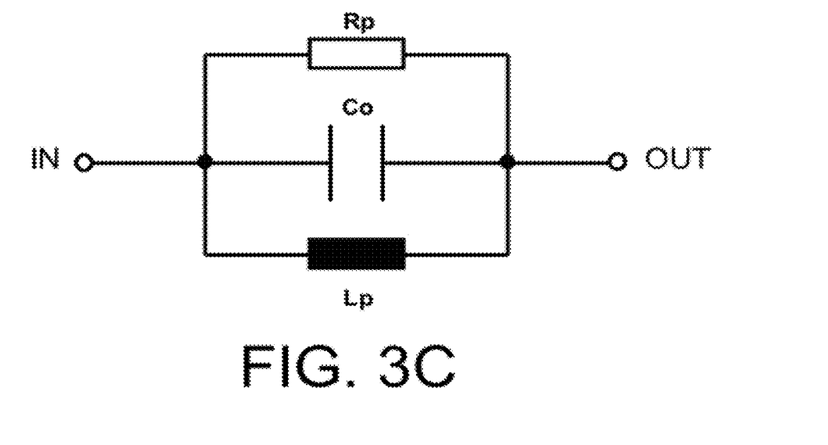
FIG. 3C shows a simplified model of a BAW resonator or FBAR at parallel resonance.

As shown in FIG. 3B, at series resonance, the device can be modeled by the series-resonant combination of Lm and Cm, in series with a parasitic resistance Rs. As shown in FIG. 3C, at parallel resonance, the device can be modeled by the parallel-resonant combination of Lm and Co, in parallel with a parasitic resistance Rp. The resistances Rs and Rp represent various heat losses and acoustic losses within the acoustic resonator.

As noted above, an acoustic resonator may be employed in an electrical filter, for example a radio frequency (RF) filter or a microwave filter. Acoustic resonators can be combined in various ways to produce a variety of filter configurations. An important characteristic of an RF or microwave filter is the insertion loss of the filter. In general it is desirable to provide RF and microwave filters with a low insertion loss (an ideal filter would have zero insertion loss). The insertion losses of an RF or microwave filter constructed with an acoustic resonator depends in turn upon the loss of the acoustic resonator, which is often expressed in terms of the resonator's quality factor, or Q, where a device with a higher Q has a lower loss than a device with a lower Q. Thus, all other things being equal, it is desirable to provide a filter with an acoustic resonator with a higher quality factor. As also noted above, an acoustic resonator may be employed in an oscillator. When an acoustic resonator is employed in an oscillator, the quality of the oscillator (e.g., phase noise) is affected by the quality factor of the acoustic resonator, where again—all other things being equal—it is desirable to provide an oscillator with an acoustic resonator with a higher quality factor. So, in general, it is desirable to improve the quality factor of an acoustic resonator. The quality factor of an acoustic resonator, in general, tracks the values of Rs and Rp in the models of FIGS. 3A and 3B which are representative of internal heat (ohmic and viscous-elastic) losses and acoustic (radiative) losses in the acoustic resonator. In particular, for a higher quality factor, the device should have a lower series resistance Rs and a higher parallel resistance Rp.

What is needed, therefore, are acoustic resonator structures that can provide an increased quality factor by exhibiting reduced internal losses.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same Generally, it is understood that the drawings and the various elements depicted therein are not drawn to scale. Further, relative terms, such as "above," "below," "top," "bottom," "upper" and "lower" may be used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Embodiments of devices disclosed herein may be based on thin film bulk acoustic resonator (FBAR) technologies. Certain details of FBAR-based devices, materials thereof, and their methods of fabrication may be found in one or more of the following commonly owned U.S. Patents and Patent Applications: U.S. Pat. No. 6,107,721, to Lakin; U.S. Pat. Nos. 5,587,620, 5,873,153, 6,507,983, and 7,629,865 to Richard C. Ruby, et al.; U.S. Pat. No. 7,280,007, entitled "Thin Film Bulk Acoustic Resonator with Mass Loaded Perimeter" to Hongjun Feng, et al.; U.S. patent application Ser. No. 11/713,726, entitled "Piezoelectric Resonator Structures and Electrical Filters having Frame Elements" to Jamneala, et al.; U.S. patent application Ser. No. 11/159,753, entitled "Acoustic Resonator Performance Enhancement Using Alternating Frame Structure" to Richard C. Ruby, et al: U.S. Pat. No. 8,248,185 entitled "Acoustic Resonator Structure Comprising a Bridge" to John Choy, et al. and filed on Jun. 24, 2009; and U.S. patent application Ser. No. 12/626, 035, entitled "Acoustic Resonator Structure Having an Electrode with a Cantilevered Portion" to John Choy, et al. and filed on Nov. 25, 2009. Examples of stacked bulk acoustic resonators, as well as their materials and methods of fabrication, may be found in U.S. Patent Application Publication 2010/0052815 of Paul Bradley et al., and published Mar. 4, 2010. The disclosures of these patents and patent applications are specifically incorporated herein by reference. It is emphasized that the components, materials and method of fabrication described in these patents and patent applications are representative and other methods of fabrication and materials within the purview of one of ordinary skill in the art are contemplated.

As noted above, acoustic resonators, and particularly bulk acoustic wave (BAW) resonators may be employed in a variety of configurations for RF and microwave devices such as filters and oscillators operating in a variety of frequency bands. For use in mobile communication devices, one particular example of a frequency band of interest is the 850 MHz "cellular band." In general, the size of a BAW resonator increases with decreasing frequency such that a BAW resonator for the 850 MHz band will be substantially larger than a similar a BAW resonator for the 2 GHz personal communication services (PCS) band. Meanwhile, there is a continual desire to make all components of a mobile communication device smaller.

Toward this end, it may be conceptually imagined that a BAW resonator having a relatively large size may be cut in half, and the two halves—each of which may be considered to be a smaller acoustic resonator—may be stacked upon one another. An example of such a stacked may be referred to as a double bulk acoustic resonator (DBAR).

Figure 4:
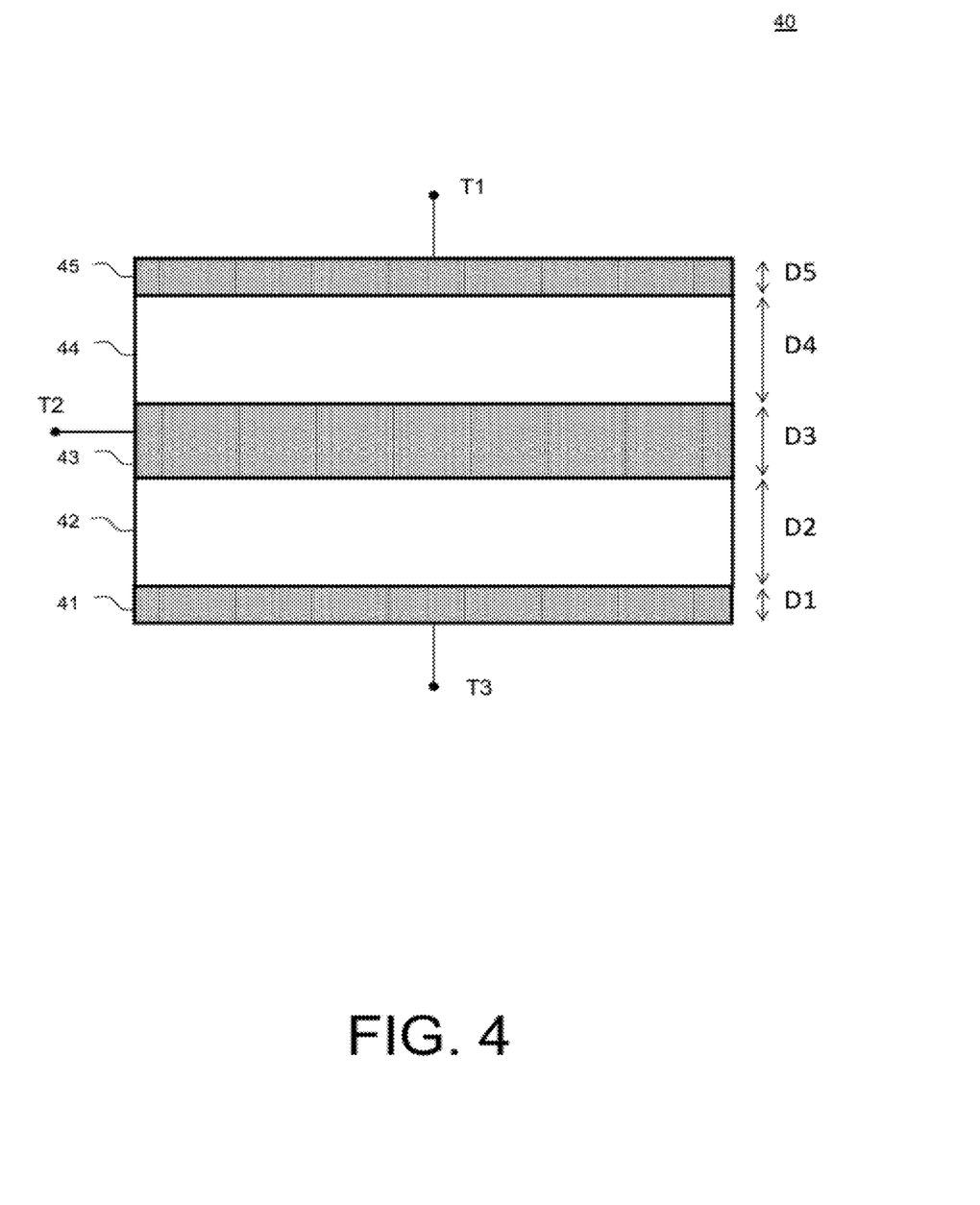
FIG. 4 illustrates a cross-section of a double thin film bulk acoustic resonator (DBAR) mechanical stack.
Figure 5:
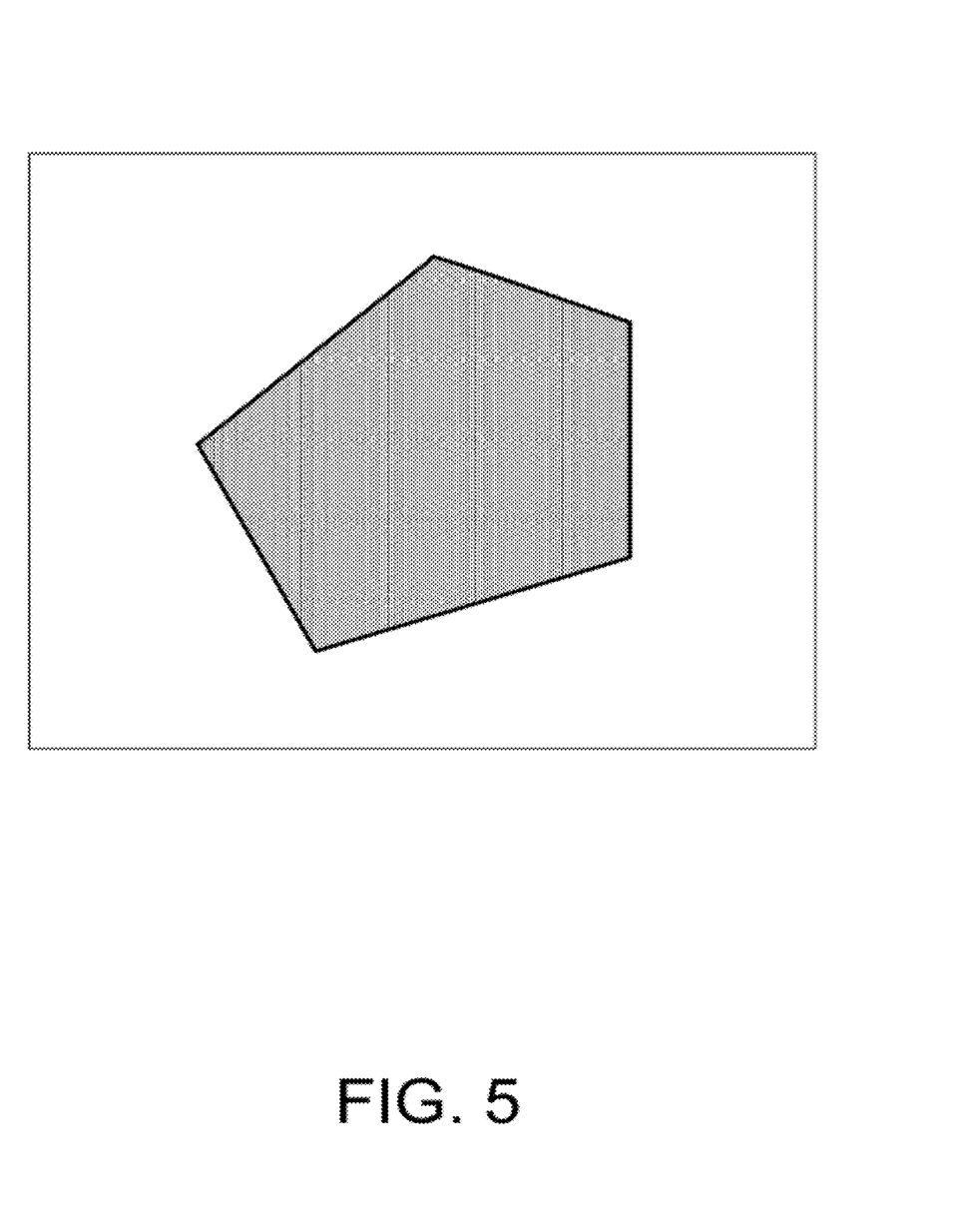
FIG. 5 illustrates a plan view of an example embodiment of a DBAR.

FIG. 4 illustrates a cross-section of a double bulk acoustic resonator (DBAR) mechanical stack 40. FIG. 5 illustrates a top view of an example embodiment of a DBAR 50, which may be the same device as DBAR 40 of FIG. 4. In the example embodiment of FIG. 5, DBAR 50 has a general shape of a pentagon. In some embodiments, closed polygon shapes with un-equal edges are used.

DBAR 40 includes a first electrode 41, a first piezo-electric layer 42, a second electrode 43, a second piezo-electric layer 44, and a third electrode 45. Compared to acoustic resonator 10 of FIG. 1, and based upon the conceptualization described above: the thickness D1 of first electrode 41 are the same as the thickness A of first electrode 11 of acoustic resonator 10; the thicknesses D2 and D4 of first and second piezo-electric layers 42 and 44 are the same as the thickness B of the piezo-electric layer 22 of acoustic resonator 10; the thickness D5 of the third electrode is the same as the thickness A of first electrode 11 of acoustic resonator 10; and the thickness D3 of the second electrode is twice the thickness A of second electrode 12 of acoustic resonator 10. In other words, in DBAR 40: D2=D4; D1=D5; and D3=2*D1=2*D5 (D1:D3:D5=1:2:1). Vertical stress and particle displacement distributions in DBAR 40 resemble very closely these of two stacked FBARs 10 (since each FBAR operates in $\lambda/2$ mode, while DBAR 40 operates in a $\lambda$ mode) thus leading to the expectation that the quality factors of these two devices would be similar.

The present inventors have discovered that, in practice, the quality factor (Q) of DBAR 40 is less than that of the "equivalent" acoustic resonator 10. Indeed, simulations have indicated that the Rp for DBAR 40 is only about 75% of the Rp of the equivalent" acoustic resonator 10. For example, in one embodiment where the Rp for acoustic resonator 10 is about 4 k$\Omega$, the Rp for the "equivalent" DBAR 40 is only about 2.8 k$\Omega$.

The present inventors have also discovered that the quality factor, or Q, of a DBAR may be improved (i.e., the Rp value may be increased) by properly selecting values for the thicknesses D1~D5 of the various layers of the DBAR, rather than just maintaining the thicknesses as they would be if a larger "equivalent" acoustic resonator was just cut in half and then the two halves were stacked upon one another where D2=D4 and D1:D3:D5=1:2:1.

Figure 6:
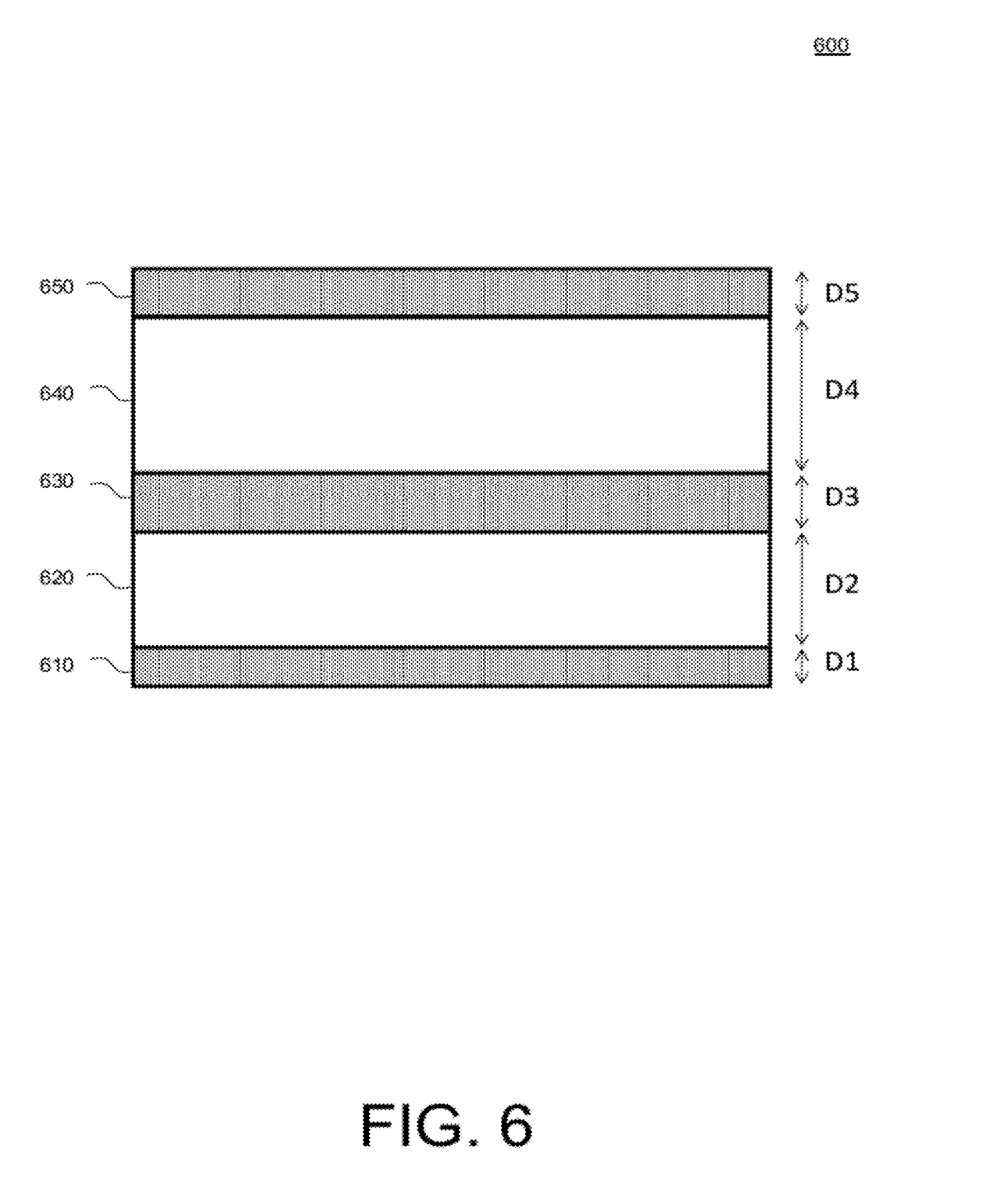
FIG. 6 illustrates a cross-section of one embodiment of a DBAR mechanical stack where the electrode layer thicknesses and piezo-electric layer thicknesses are different from each other

FIG. 6A illustrates a cross-section of one embodiment of a DBAR 600 mechanical stack where the electrode layer thicknesses and piezo-electric layer thicknesses are different from each other. DBAR 600 includes a first electrode 610, a first piezo-electric layer 620, a second electrode 630, a second piezo-electric layer 640, and a third electrode 650. DBAR 60 differs from DBAR 40 in that D2≠D4 and D1:D3:D5≠1:2:1. Indeed, in the generalized example of DBAR 600, the thicknesses D1, D2, D3, D4, and D5 may all be different from each other. As noted above, the inventors have discovered that by allowing the values of D1, D2, D3, D4, and D5 to be arbitrary, values may be selected which provide an improved quality factor compared to the quality factor provided by the baseline DBAR 40 of FIG. 4.

In general, one of the main reasons for a loss of quality factor in DBARs (and BAWs in general) pertains to so-called eigenmodes. Eigenmodes are the specific forms of stack vibrations that can propagate away from the main membrane region. The acoustic energy carried away by the eigenmodes cannot be coupled back to the electric field, resulting in degradation of the quality factor, Q, and thus an increased insertion loss for the device (e.g., filter). The modification of layer thicknesses in DBAR 600 (as compared to the baseline DBAR 400) allows the quality factor. Q, to be increased by: (1) suppressing the excitation of the eigenmodes; and (2) lowering the coupling of strongly excited thickness-extensional modes to weakly-excited or not-excited shear modes, thereby reducing the number of modes that can effectively carry acoustic energy away. An optimal stack design can be found numerically (and ultimately verified experimentally) by minimization of energy contained in each eigenmode and by minimization of possible couplings between similarly polarized eigenmodes. Such optimal layer thicknesses may, in general, depend on specific filter application and materials used.

Figure 7:
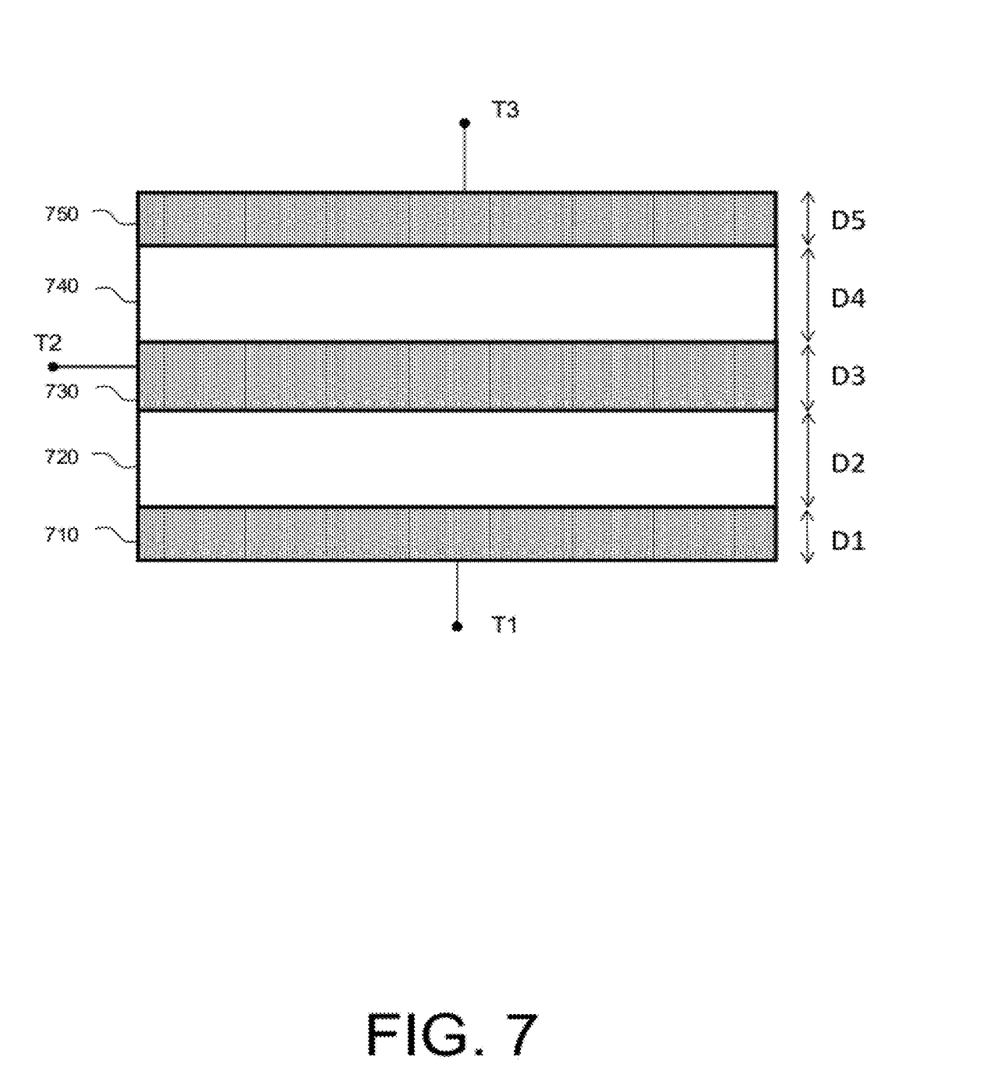
FIG. 7 illustrates a cross-section of one embodiment of a DBAR mechanical stack where the electrode layer thicknesses and piezo-electric layer thicknesses are selected to provide a high quality factor.

FIG. 7 illustrates a cross-section of one embodiment of a DBAR 700 mechanical stack where the electrode layer thicknesses and piezo-electric layer thicknesses are selected to provide a high quality factor. DBAR 700 includes a first electrode 710, a first piezo-electric layer 720, a second electrode 730, a second piezo-electric layer 740, and a third electrode 750.

The piezoelectric material for first and second piezo-electric layers 720 and 740 may include, for example, aluminum nitride (AlN) and zinc oxide (ZnO). First, second, and third electrodes 710, 720 and 730 each comprise an electrically conductive layer and may comprise a metal layer, for example a tungsten (W) or molybdenum (Mo) layer.

In general, in DBAR 700 the thickness D1 of first electrode 710 may be the same as the thickness D5 of third electrode 750. Also, the thickness D3 of second electrode 730 may be greater than the thickness D1 of first electrode 710 but less than or equal to 1.8 times the thickness D1 of first electrode 710, and be greater than the thickness D5 of third electrode 750 but less than or equal to 1.8 times the thickness D5 of third electrode 750.

In a beneficial arrangement, in DBAR 700 the thickness D1 of first electrode 710 may be approximately the same as the thickness D5 of third electrode 750, and the thickness D3 of second electrode 730 may be between 1.15 to 1.25 times the thickness D of first electrode 710, and between 1.15 to 1.25 times the thickness D5 of third electrode 750. In another particular beneficial arrangement, in DBAR 700 the thickness D3 of second electrode 730 may be between 1.17 to 1.22 times the thickness D1 of first electrode 710, and between 1.17 to 1.22 times the thickness D5 of third electrode 750. In another particular beneficial arrangement, in DBAR 700 the thickness D3 of second electrode 730 may be approximately 1.20 times the thickness D1 of first electrode 710, and approximately 1.20 times the thickness D5 of third electrode 750. In still another beneficial arrangement, in DBAR 700 the thickness D3 of second electrode 730 may be approximately 1.5 times the thickness D1 of first electrode 710, and approximately 1.5 times the thickness D5 of third electrode 750.

The present inventors have discovered that the particular relationships between the thicknesses of electrodes 710, 730 and 750 as described above may improve the quality factor, Q, of DBAR 700 compared to the baseline DBAR 40. In some embodiments, these particular relationships between the thickness of electrodes 710, 730 and 750 may improve the quality factor. Q, of DBAR 700 compared to the baseline DBAR 40 by 10% to 50%.

As a particular concrete, but non-limiting, example of DBAR 700, in one embodiment: D1=7.5 kÅ; D2=18 kÅ; D3=9 kÅ: D4=18 kÅ; and D5=7.5 kÅ.

DBAR 700 includes a first acoustic resonator comprising first electrode 710, second electrode 730, and first piezo-electric layer 720; and a second acoustic resonator comprising second electrode 730, third electrode 750, and second piezo-electric layer 740.

FIG. 7 also shows a first terminal T1 connected to first electrode 710, a second terminal T2 connected to second electrode 730, and a third terminal T3 connected to third electrode 750. In a particular configuration, the first terminal T1 is directly connected to the third terminal T3 as a result of which the first terminal T1 in connected to the first and third electrodes and the second terminal T2 is connected to the second electrode such that the first and second acoustic resonators as described above are configured to be in parallel with each other.

Figure 8:
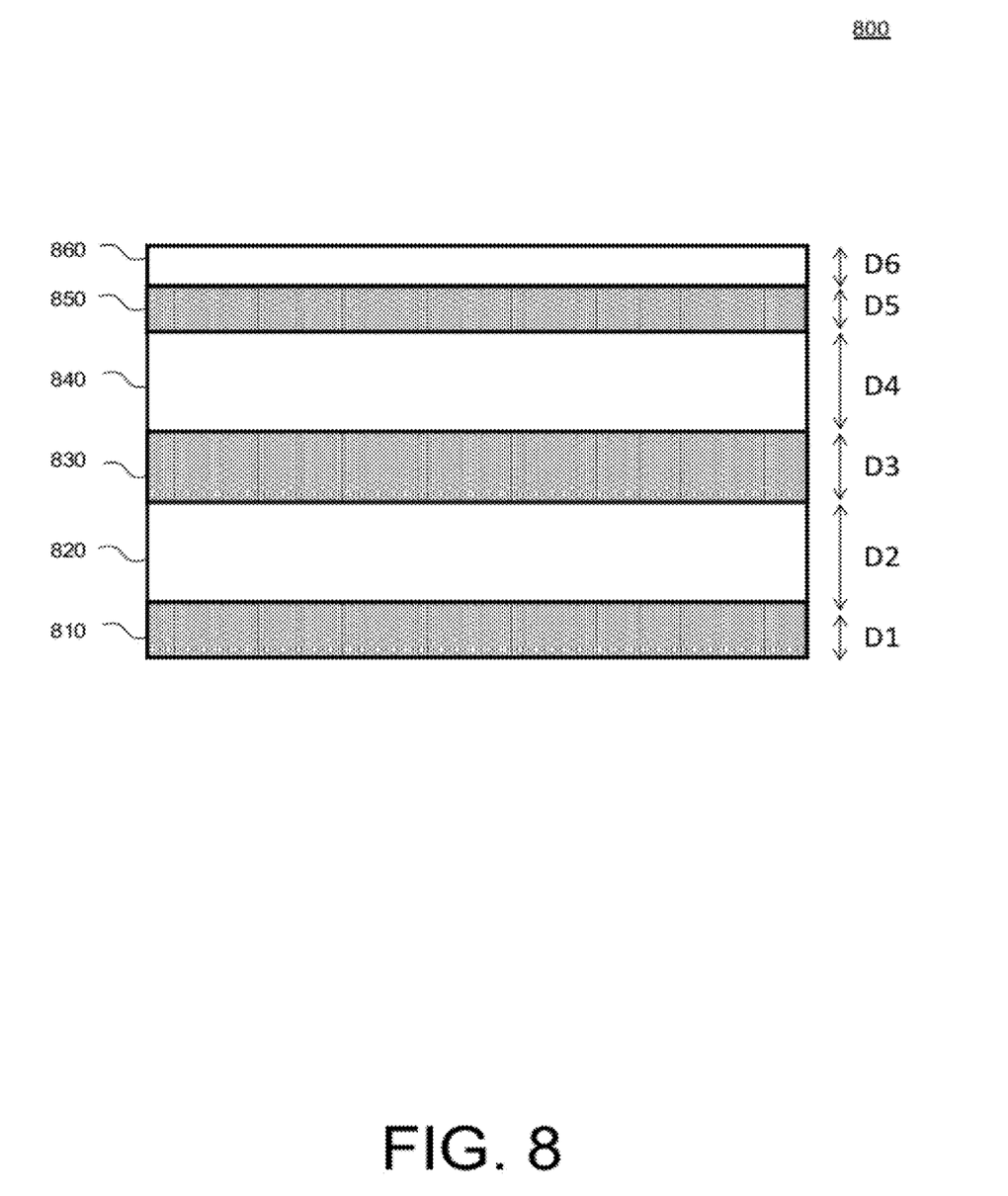
FIG. 8 illustrates a cross-section of another embodiment of a DBAR mechanical stack where the electrode layer and piezo-electric layer thicknesses are selected to provide a high quality factor.

FIG. 8 illustrates a cross-section of another embodiment of a DBAR 800 mechanical stack, where the electrode layer and piezo-electric layer thicknesses are selected to provide a high quality factor. DBAR 800 includes a first electrode 810, a first piezo-electric layer 820, a second electrode 830, a second piezo-electric layer 840, and a third electrode 850.

DBAR 800 is similar to DBAR 700 such that only the differences between DBAR 800 and DBAR 700 will be described in detail.

DBAR 800 includes a passivation layer 860 provided on third electrode 850. In some embodiments, passivation layer 860 may comprise a layer of AlN. Passivation layer 860 is typically added to DBAR 700 in order to prevent corrosion of the third electrode 850 during the subsequent processing steps and also to help with final tuning of device's resonant frequency.

In some embodiments of DBAR 800 where passivation layer 860 provided on third electrode 850, the thickness D5 of third electrode 850 may be reduced compared to the thickness D1 of first electrode 810. In one example, the thickness D5 of third electrode 850 may be reduced by about 5-10% (e.g., approximately 500 Å) compared to thickness D1 of first electrode 810. In that case, the thickness D3 of second electrode 830 may be between 1.15 to 1.25 times the thickness D1 of first electrode 710. In a particular beneficial arrangement, the thickness D3 of second electrode 830 may be between 1.17 to 1.22 times the thickness D1 of first electrode 810. In another particular beneficial arrangement, the thickness D3 of second electrode 830 may be approximately 1.20 times the thickness D1 of first electrode 810.

Figure 9:
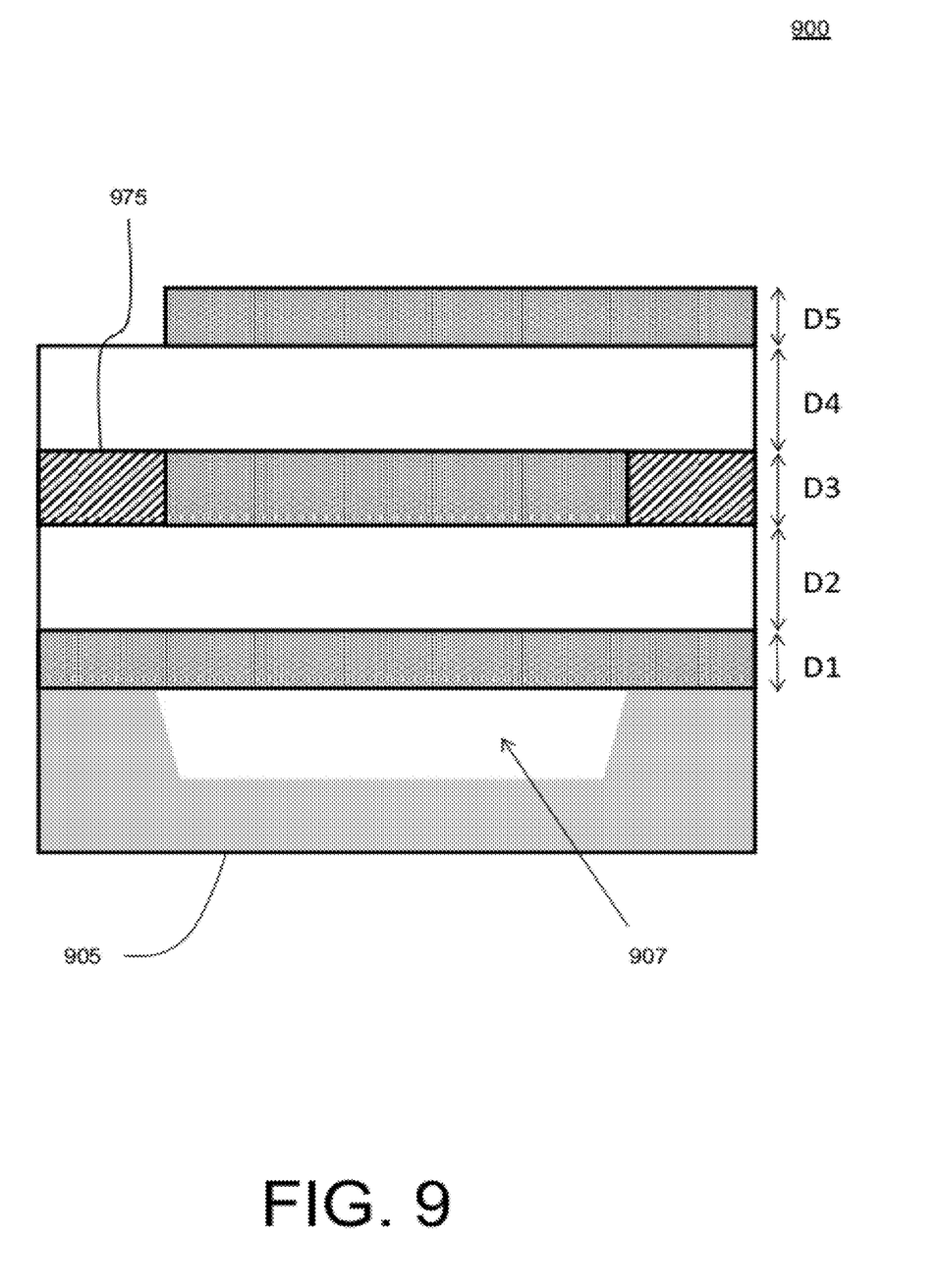
FIG. 9 illustrates a cross-section of another embodiment of a DBAR device where the electrode layer and piezo-electric layer thicknesses are selected to provide a high quality factor.

FIG. 9 illustrates a cross-section of another embodiment of a DBAR 900 device where the electrode layer and piezo-electric layer thicknesses are selected to provide a high quality factor.

DBAR 900 is the same as .DBAR 700, except that FIG. 9 shows the DBAR structure being provided on a substrate 905 above a recess 907 provided in the top surface of substrate 905. In practical devices the second electrode is often planarized with various materials 975, like NEBSG, to simplify further processing. The device shown in FIG. 9 represents a DBAR 900 incorporating a film bulk acoustic resonator (FBAR) structure. It should be understood that DBAR 800 may also be provided on a substrate above a recess in the top surface thereof. Also, in other embodiments, a DBAR such as DBAR 700 or 800 may be provided on a substrate having a Bragg reflector beneath the DBAR to realize a DBAR with an SMR structure.

Figure 10:
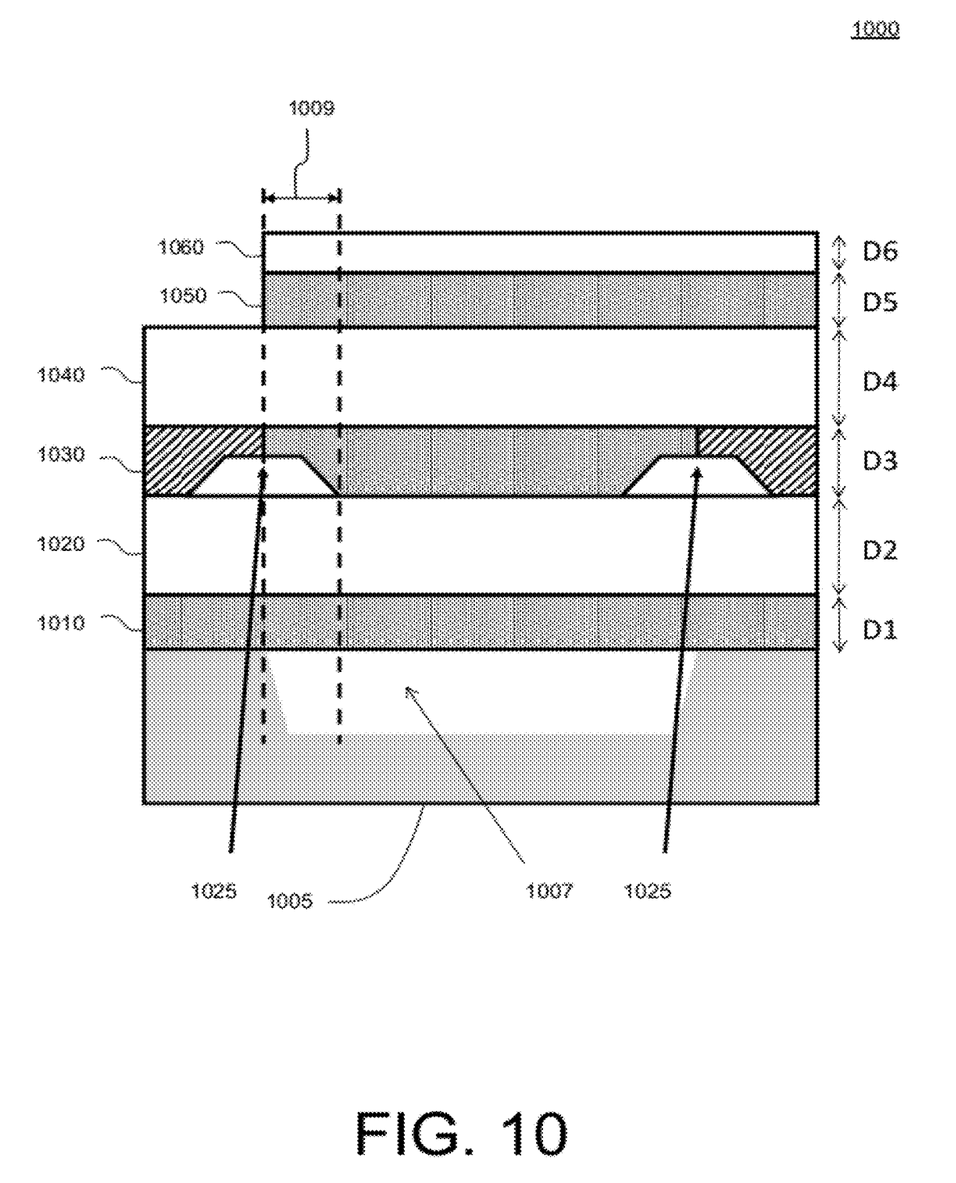
FIG. 10 illustrates a cross-section of yet another embodiment of a DBAR device where the electrode layer and piezo-electric layer thicknesses are selected to provide a high quality factor, with further improvements provided by an air-bridge.

FIG. 10 illustrates a cross-section of yet another embodiment of a DBAR 1000 where the electrode layer and piezo-electric layer thicknesses are selected to provide a high quality factor, or Q.

DBAR 1000 is similar to DBAR 900 such that only the differences between DBAR 1000 and DBAR 900 will be described in detail.

DBAR 1000 includes a first electrode 1010, a first piezo-electric layer 1020, a second electrode 1030, a second piezo-electric layer 1040, a third electrode 1050, a passivation layer 1060, and an air-bridge 1070. Example embodiments of DBAR structures with air-bridges are disclosed in U.S. patent application Ser. No. 13/074,262 entitled "STACKED ACOUSTIC RESONATOR COMPRISING A BRIDGE," filed on 29 Mar. 2011 in the names of Dariusz Burak et al., the entirety of which is hereby incorporated by reference herein.

FIG. 10 illustrates that in DBAR 1000 air-bridge 1025 is disposed under second electrode 1030 along a periphery of DBAR 1000. The inventors have discovered that in some embodiments one or more such air-bridges may improve the quality factor, Q, of DBAR 1000. In some embodiments, air-bridge 1025 is 3-10 μm wide, 300-1500 Å tall, and has an overlap 1009 of 0-5 μm with respect to recess 1007 in substrate 1005. For example, in one embodiment air-bridge 1025 may be 5 μm wide, 500 Å tall, and have an overlap 1009 of 2 μm with respect to recess 1007.

Figure 11:
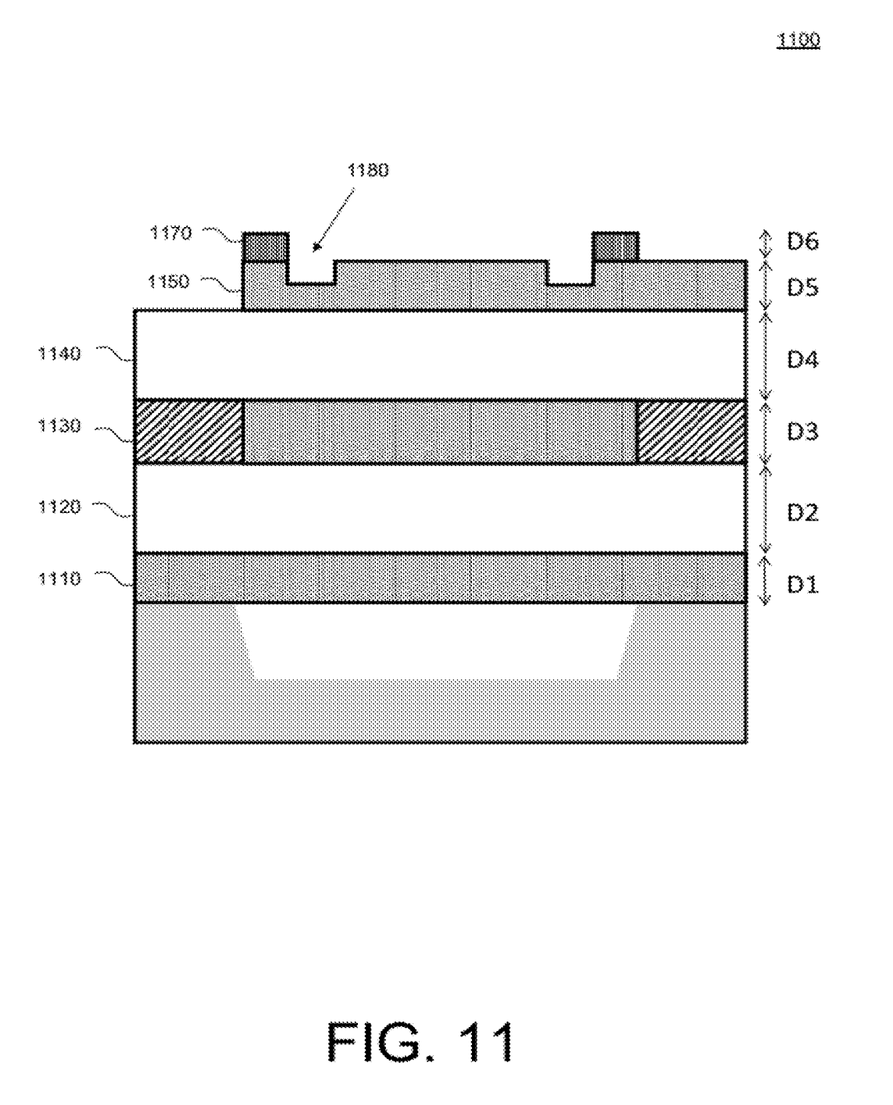
FIG. 11 illustrates a cross-section of still another embodiment of a DBAR device where the electrode layer and piezo-electric layer thicknesses are selected to provide a high quality factor, with further improvements provided by lateral acoustic termination elements.

FIG. 11 illustrates a cross-section of still another embodiment of a DBAR 1100 device where the electrode layer and piezo-electric layer thicknesses are selected to provide a high quality factor. DBAR 1100 includes a first electrode 1110, a first piezo-electric layer 1120, a second electrode 1130, a second piezo-electric layer 1140, and a third electrode 1150.

DBAR 1100 is similar to DBAR 900 such that only the differences between DBAR 1100 and DBAR 900 will be described in detail.

DBAR 1100 includes acoustic termination structures 1170 and 1180. Example embodiments of a DBAR with termination structures 1170 and 1180 are disclosed in U.S. patent application Ser. No. 13/074,094 entitled "STACKED BULK ACOUSTIC RESONATOR AND METHOD OF FABRICATING THE SAME," filed on 29 Mar. 2011 in the names of Alexandre Shirakawa et al., the entirety of which is hereby incorporated by reference herein. Acoustic termination structure 1170 represents a mass loading applied at the periphery of third electrode 1150, and acoustic termination structure 1180 represents a region, also near the periphery of third electrode 1150, where the thickness of third electrode 1150 is reduced from its nominal value. The particular acoustic termination structures 1170 and 1180 are exemplary, and different combinations of termination structures may be provided in different embodiments. The use of termination structures is known in the art for improving the characteristics of bulk acoustic resonators, including SMRs and FBARs. FIG. 11 illustrates that such termination structures also may be applied to a DBAR to improve characteristics of the DBAR. Although not shown in FIG. 11, a passivation layer similar to that shown in FIGS. 8 and 10 may be applied to DBAR 1100.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A device, comprising:
   a first terminal;
   a first acoustic resonator comprising a first electrode, a second electrode, and a first piezo-electric layer extending between the first and second electrodes;
   a second acoustic resonator comprising the second electrode, a third electrode, and a second piezo-electric layer extending between the second and third electrodes; and
   a second terminal,
   wherein the first terminal is connected to the first and third electrodes and the second terminal is connected to the second electrode such that the first and second acoustic resonators are configured to be in parallel with each other, and wherein a thickness of the second electrode is greater than a thickness of the first electrode and less than or equal to approximately 1.8 times the thickness of the first electrode.

2. The device of claim 1, wherein a thickness of the third electrode is equal to the thickness of the first electrode.

3. The device of claim 1, wherein the thickness of the second electrode is between approximately 1.15 and approximately 1.25 times the thickness of the first electrode.

4. The device of claim 1, wherein the thickness of the second electrode is approximately 1.20 times the thickness of the first electrode.

5. The device of claim 1, further comprising a passivation layer disposed on the third electrode.

6. The device of claim 1, further comprising a substrate having a cavity disposed in a surface thereof, wherein the first and second acoustic resonators are disposed on the substrate above the cavity.

7. The device of claim 1, wherein a thickness of the first piezo-electric layer equals a thickness of the second piezo-electric layer.

8. A device, comprising:
a first electrode having a first electrode thickness;
a first piezo-electric layer disposed on the first electrode, the first piezo-electric layer having a first piezo-electric layer thickness;
a second electrode disposed on the first piezo-electric layer and having a second electrode thickness;
a second piezo-electric layer disposed on the second electrode, the second piezo-electric layer having a second piezo-electric layer thickness; and
a third electrode disposed on the second piezo-electric layer and having a third electrode thickness,
wherein the second electrode thickness is between approximately 1.15 and approximately 1.25 times the thickness of the first electrode.

9. The device of claim 8, wherein the third electrode thickness is equal to the first electrode thickness.

10. The device of claim 8, wherein the second electrode thickness is approximately 1.20 times the first electrode thickness.

11. The device of claim 10, wherein the first piezo-electric layer thickness equals the second piezo-electric layer thickness.

12. The device of claim 10, further comprising at least one acoustic termination structure disposed on the third electrode along a periphery of the device.

13. The device of claim 10, further comprising a bridge disposed beneath the second electrode along a periphery of the device.

14. The device of claim 8, further comprising a substrate having a cavity disposed in a surface thereof, wherein the first electrode is disposed on the substrate above the cavity.

* * * * *